United States Patent [19]

Suzuki

[11] Patent Number: 5,303,194
[45] Date of Patent: Apr. 12, 1994

[54] READ ONLY MEMORY

[75] Inventor: Hiroshi Suzuki, Ichikawa, Japan

[73] Assignee: Kawasaki Steel Corporation, Hyogo, Japan

[21] Appl. No.: 965,421

[22] Filed: Oct. 23, 1992

[30] Foreign Application Priority Data

Oct. 30, 1991 [JP] Japan .................. 3-311918

[51] Int. Cl.$^5$ .............................................. G11C 9/00
[52] U.S. Cl. .............................. 365/203; 365/189.05; 365/189.11
[58] Field of Search ...................... 365/189.01, 189.05, 365/190, 189.11, 203

[56] References Cited

U.S. PATENT DOCUMENTS 4,603,403 7/1986 Toda .................................... 365/190

Primary Examiner—Joseph A. Popek
Attorney, Agent, or Firm—Oliff & Berridge

[57] ABSTRACT

A read only memory for eliminating the unpredictable logic states of bit lines in order to prevent the generation of false logic states while avoiding increase in power dissipation. The memory comprises bit lines, sense amplifiers, bit data holding device and reset device. The logic state of a given bit line is output by the applicable sense amplifier as bit data. In either the High or the Low state, that bit line enters a floating state that can vary with precharged electric charge. The potentially destabilizing state is circumvented by the bit data holding device which prevents the logic state of the bit line from becoming unpredictable. During precharging, the reset device resets the bit line state held by the bit data holding device. This prevents a through current from flowing even if the logic state of the applicable bit line changes.

6 Claims, 6 Drawing Sheets

| WORD ADDRESS | BIT ADDRESS | | |
|---|---|---|---|
| | 0 | 1 | ...... |
| 0 | 1 | 0 | ...... |
| 1 | 0 | 0 | ...... |
| 2 | 0 | 0 | ...... |
| 3 | 1 | 0 | ...... |

READ ONLY MEMORY

BACKGROUND OF THE INVENTION

1. Field of the Invention

The present invention relates to a read only memory for storing bit data in accordance with the presence or absence of a transistor at the intersection of a bit line and a word line corresponding to each of the addresses of bit data to be stored. More particularly, the invention relates to a read only memory capable of preventing logic state malfunction by eliminating the unpredictable logic states of bit lines.

2. Prior Art

While random access memories (RAM's) are generally volatile when it comes to retaining their contents, read only memories (ROM's) are non-volatile in terms of data retention. The so-called mask ROM is one of such ROM's. The memory contents of this ROM are permanently built into the device during its integrated circuit manufacture. For example, a suitable mask is used during the manufacturing stage to fix the state of a transistor presence or absence (on- or off-state) at the intersection of a bit line and a word line representing each of the addresses of bit data to be stored. The bit data thus written permanently are highly reliable in data status constancy compared with the programmable ROM (PROM), another type in the ROM category.

Figure 3:
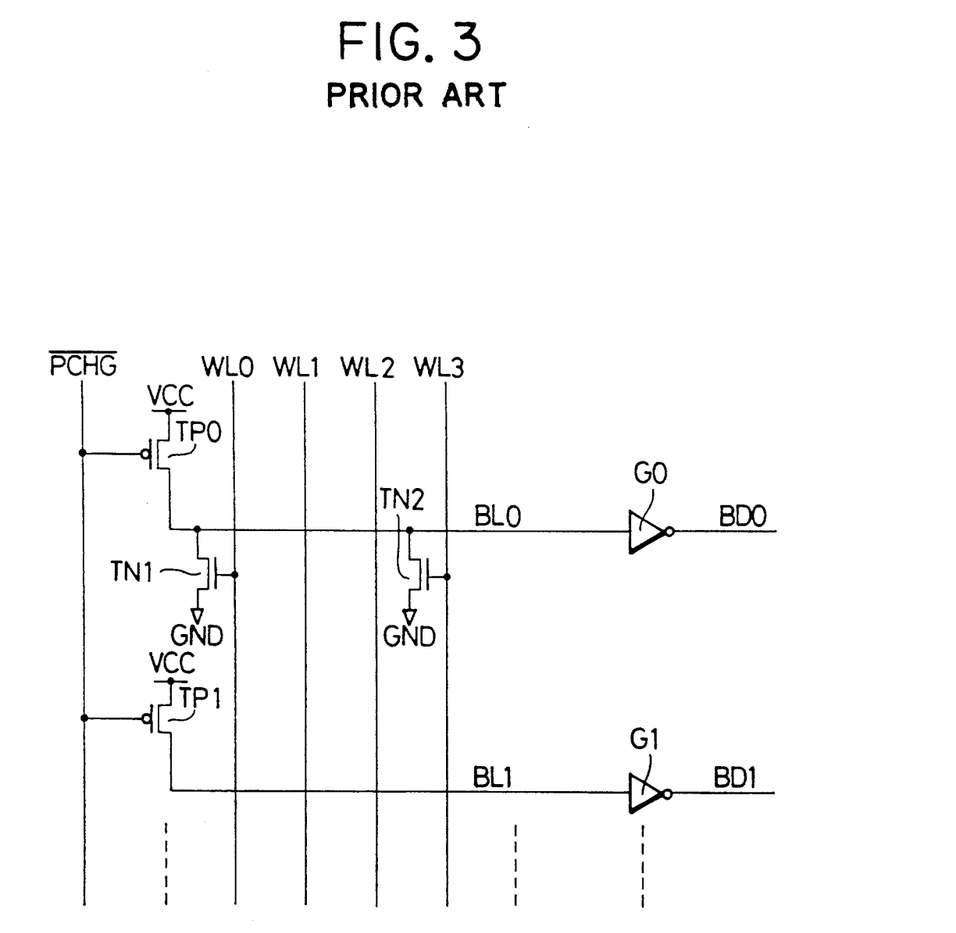
FIG. 3 is a circuit diagram of the first prior art example of the typical conventional CMOS mask ROM.

FIG. 3 is a circuit diagram of a first prior art example of the conventional CMOS (complementary metal oxide semiconductor) mask ROM. FIG. 3 emphasizes that portion of the CMOS mask ROM which stores bit data.

In FIG. 3, reference characters WL0 through WL3 stand for word lines and BL0 and BL1 for bit lines. Reference characters $\overline{PCHG}$ designate a precharge line. This line goes Low for a predetermined period for precharging before any one of the word lines WL0 through WL3 is brought High for the applicable bit data to be read out.

The mask ROM is designed to minimize the number of transistors so as to increase the degree of integration. For that purpose, bit data are generally written by simply establishing the presence or absence of a transistor (also called a memory cell transistor hereinafter) at the intersection of a bit line and a word line representing each of the addresses of the bit data to be stored. In other words, bit data are not written by selecting either a transistor connected to the power supply or a transistor connected to ground.

In the mask ROM of the above construction, precharging is performed prior to the access stage for data read operations. The precharging action involves charging the bit lines beforehand up to the power supply level. During read access, the bit line with its memory cell transistor intersecting an enabled word line is discharged to reach ground level. At this point, the bit lines with no memory cell transistor intersecting the enabled word line remain at their power supply level.

In FIG. 3, the leftmost positions of the bit lines BL0 and BL1 are connected respectively to the sources of P-channel MOS transistors TP0 and TP1 with their drains connected to the power supply VCC. The bit data are written by establishing the presence or absence of N-channel MOS transistors TN1 and TN2 which are the memory cell transistors.

When any one of the word lines WL0 through WL3 is brought High, the states of the bit lines BL0 and BL1 are read out as bit data respectively to bit data lines BD0 and BD1 by inverters G1 and G2 acting as sense amplifiers.

There are three representative methods for establishing the presence or absence of memory cell transistors at the intersections between bit lines and word lines and for permanently fixing the bit data states thus determined. One such method is a diffusion layer code mask method that involves determining the presence or absence of a diffusion layer region that corresponds to the source and drain of each memory cell transistor. Another method is an ion implantation code mask method that varies the threshold value of a given memory cell transistor by means of ion implantation, thereby switching the on- and off-states of that transistor. The other method is a contact code mask method that uses a contact mask to switch the presence and absence of connection contacts between memory cell transistors on the one hand, and bit or word lines on the other.

Figure 4:
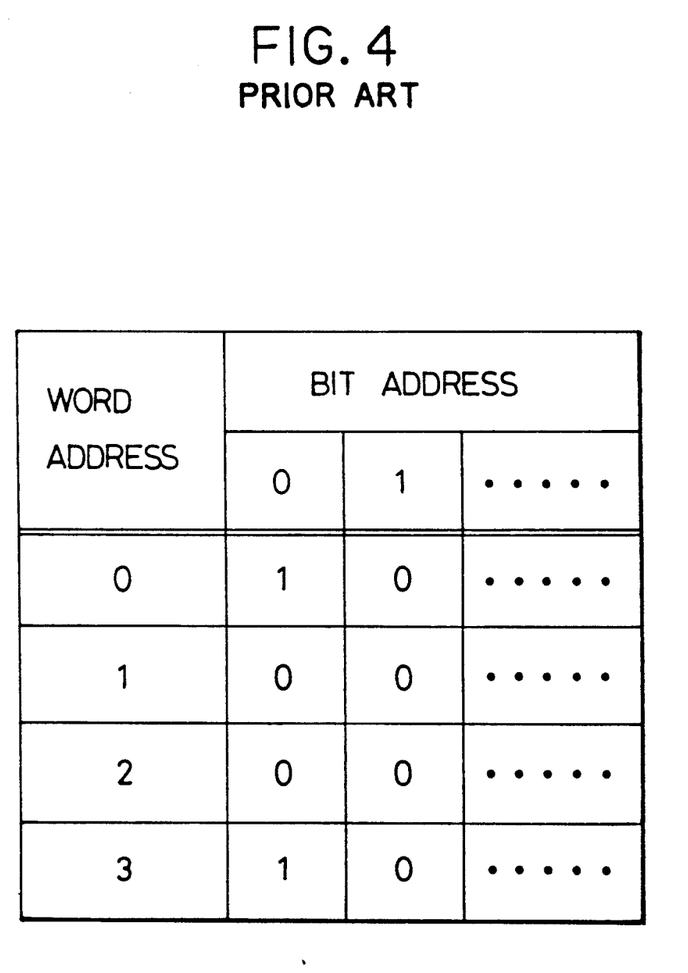
FIG. 4 is a diagram showing some bit data written in the first prior art example of FIG. 3.

FIG. 4 is a diagram showing some bit data written in the first prior art example of the mask ROM. In FIG. 4, each of word addresses "0" through "3" corresponds to the High state of any one of the word lines WL0 through WL3 in the first prior art example. Bit addresses "0", "1"... in FIG. 4 correspond to the bit lines BL0 and BL1 in FIG. 3.

The word line WL0 and the bit line BL0, connected to the N-channel MOS transistor TN1 (memory cell transistor) in the first prior art example, correspond respectively to word address "0" and bit address "0" of FIG. 4. Bit date of the two addresses represent "1" (High state). The word line WL3 and the bit line BL0, connected to the N-channel MOS transistor TN2 (memory cell transistor) in the first prior art example, correspond respectively to word address "3" and bit address "0" of the FIG. 4. Bit data of the two addresses also represent "1" (High state). All other bit data in the diagram shown in FIG. 4 are "0" (Low states).

Figure 5:
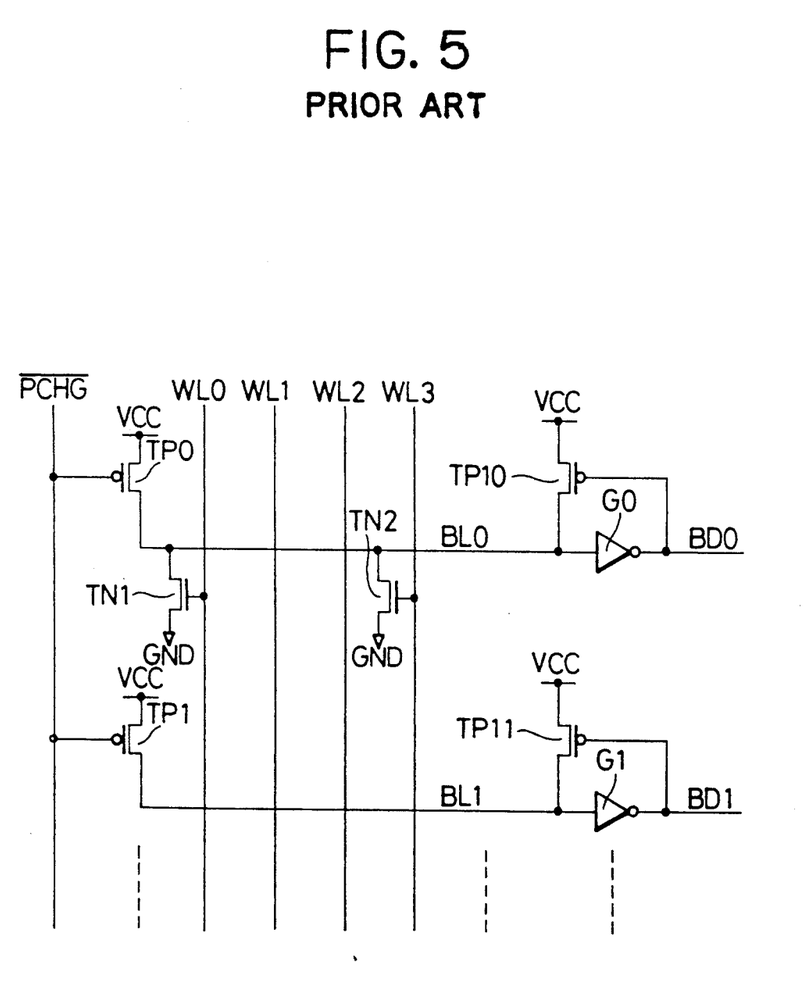
FIG. 5 is a circuit diagram of the second prior art example of the typical conventional CMOS mask ROM.

FIG. 5 is a circuit diagram of a second prior art example of the prior art CMOS mask ROM. In FIG. 5, reference characters TP0, TP1, TN1, TN2, G0, G1, WL0 through WL3, BL0, BL1, BD0, BD1, $\overline{PCHG}$, VCC and GND designate the same parts as those in FIG. 3. The bit data written in the second prior art example are also the same as those shown in FIG. 4.

In the second prior art example, bringing the outputs of the inverters G0 and G1 Low turns on the P-channel MOS transistors TP10 and TP11 that correspond respectively to the inverters. The inputs to the inverters G0 and G1 are held High. The data states established in the second prior art example are the same as those in FIG. 4.

One disadvantage of the first prior art example is that, while "0" (Low state) is being read out, the logic state of the applicable bit line tends to float, i.e., connected neither to the power supply VCC nor to ground GND. the unstable floating state can cause the bit data "0" being read out to turn itself into "1" (High state). This is because the logic state of the bit line corresponding to the Low state under reading relies solely on the electric charge from the precharging operation.

Figure 6:
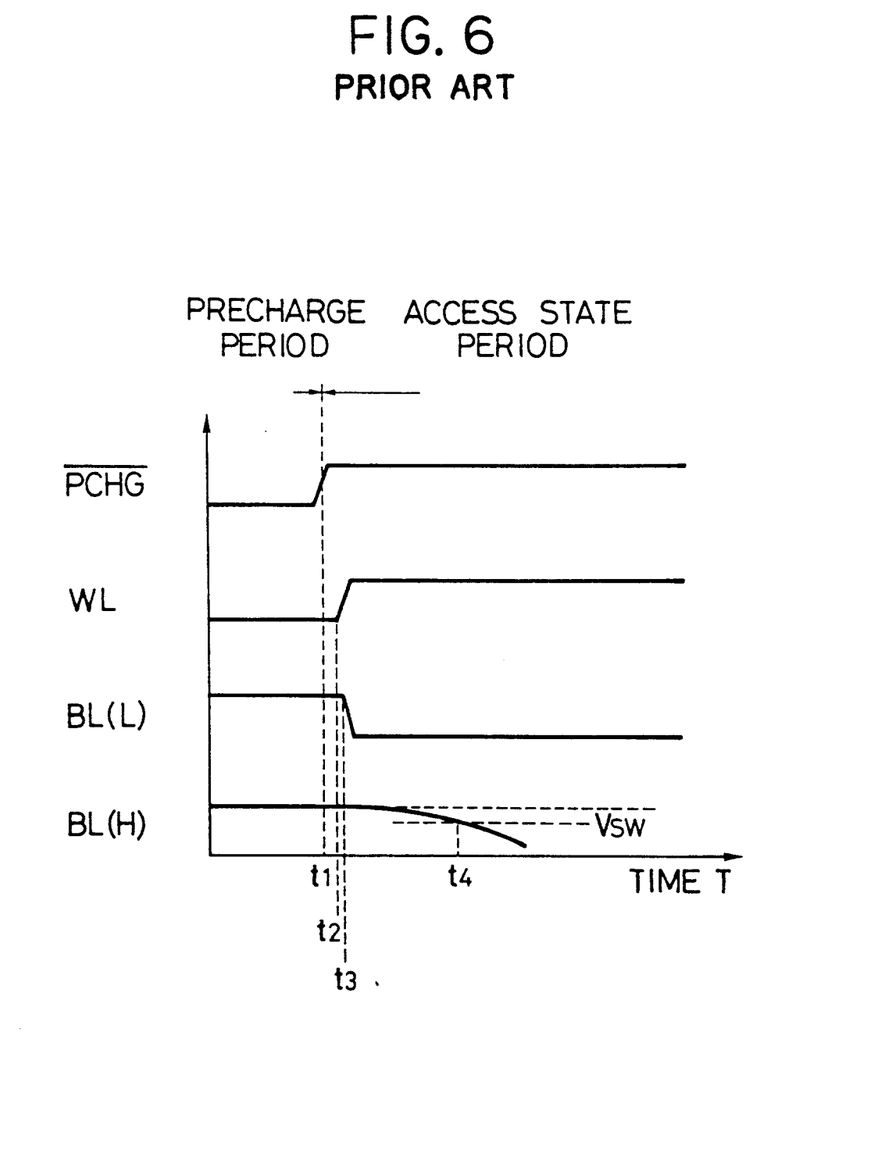
FIG. 6 is a timing chart in effect when bit data are read from the first prior art example.

FIG. 6 is a timing chart in effect when bit data are read from the first prior art example. In FIG. 6, reference characters $\overline{PCHG}$ indicate the timing of the logic state of the precharge line represented by the same reference characters ($\overline{PCHG}$) in FIG. 3. Reference characters WL of FIG. 6 indicate the timing of the logic state of any one of the word lines WL0 through WL3 in FIG. 3. Reference characters BL(L) stand for the timing of the logic state in effect when the Low state of the bit line BL0 or BL1 in FIG. 3 is read out. Reference characters BL(H) represent the logic state in effect when the High state of the bit line BL0 or BL1 in FIG. 3 is read out.

In FIG. 6, a time $t_1$ is preceded by a precharge period wherein the logic state $\overline{PCHG}$ takes the Low state. The time $t_1$ is followed by an access state period wherein the logic state $\overline{PCHG}$ is the High state. At a time $t_2$, the logic state WL is the High state.

When a bit line is brought Low and a High-state bit data is read out therefrom, the logic state BL(L) becomes Low at a time $t_3$ in response to the logic state WL being High. When a bit line is brought High and a Low-state bit data is read out therefrom, the logic state BL(H) remains High thanks to the electric charge from the precharge period even as the logic state WL goes High after the access state period has started. However, because the High state of BL(H) relies on the amount of electric charge, the voltage drops following the discharge.

As shown in FIG. 6, the voltage level of BL(H) drops below a threshold value Vsw at a time $t_4$. This causes the logic state of the applicable bit line to go Low. That is, the Low-state output of the inverter G0 or G1 in FIG. 3 can become High. This is one or the disadvantage of the first prior art example.

One disadvantage of the second prior art example is as follows: After a given bit line is brought High by a precharge operation, while "1" (High state) is being read out the bit line goes Low and a High-state bit data is read out therefrom. In this case, a through current flows across the P-channel MOS transistor for holding the logic state of bit line to the memory cell transistor (N-channel MOS transistor) that is turned on upon read-out. As a result, power dissipation is promoted.

For example, in FIG. 5, a precharging operation brings the outputs of the inverters G0 and G1 Low, followed by P-channel MOS transistors TP10 and TP11 being turned on. Thereafter, the bit data corresponding to the word line WL0 and the bit line BL0 are read out. This turns on both the P-channel MOS transistor TP10 and the N-channel MOS transistor TN1 and keeps them on until the output of the inverter G0 becomes High. A through current flows across these two transistors from the power supply VCC to the ground GND. Power consumption is increased in this manner.

SUMMARY OF THE INVENTION

It is therefore an object of the present invention to overcome the above-described drawbacks and disadvantages of the prior art and to provide a read-only memory that eliminates the unpredictable logic states of bit lines in order to prevent the generation of false logic states while avoiding increase in power dissipation.

In carrying out the invention and according to one aspect thereof, there is provided a read-only memory for storing bit data by establishing any one of the presence and absence of a transistor at the intersection between a bit line and a word line corresponding to each of the addresses of the bit data to be stored, the read-only memory comprising: bit data holding means for holding the logic state of the bit line of which the logic state is currently read out, thereby preventing the destabilization of the logic state attributable to the disconnection of the transistor at the intersection corresponding to the address being read out; and reset means for resetting the held logic state of the bit line prior to the selection of a word line.

The mask ROM is designed to minimize the number of built-in transistors in order to enhance its degree of integration. This objective is usually pursued by simply establishing the presence or absence of a memory cell transistor at the intersection between a bit line and a word line correspond to each of the addresses of the bit data to be stored. That is, establishing the presence or absence of each memory cell transistor writes bit data. In other words, a bit is not determined by selecting one of two kinds of presence, i.e., by selecting either a transistor connected to the power supply or a transistor connected to ground.

In the mask ROM of this construction, a given bit line may enter a floating state (wherein the memory cell transistor is connected neither to the power supply nor to ground) depending on the status of the bit data written. That is, where addresses with no memory cell transistors are read out, the bit line tends to "float." In that floating state, the logic states of the bit lines become unpredictable and can produce false bit data when accessed.

Measures must be taken to retain the true logic states of the bit lines. However, as discussed in connection with the second prior art example, attempts so far to inhibit the floating states of the bit lines can let the through current promote power dissipation of the mask ROM. The present invention addresses the causes of the through current and proposes bit data holding means effectively to remove the phenomenon while suppressing power consumption.

As described in conjunction with the second prior art example, the typical read only memory designed conventionally to hold the logic states of bit lines leaves a through current flowing unchecked when precharging is performed or when a memory cell transistor connected to a transistor is read out for bit data. To prevent this kind of through current, the present invention proposes reset means for resetting the logic states of the bit lines. The reset operation of the reset means is carried out during precharging.

Figure 1:
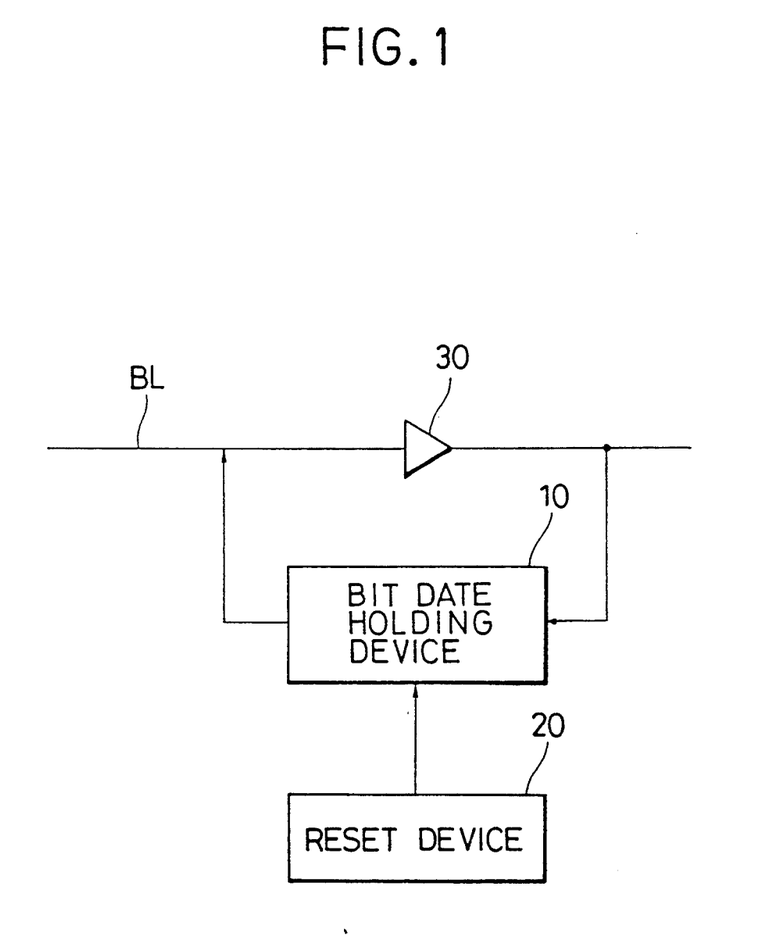
FIG. 1 is a block diagram showing a principal structure of a read only memory embodying the invention.

FIG. 1 is a block diagram showing a principal structure of a read only memory embodying the invention. In FIG. 1, a sense amplifier 30 reads the logic state of a bit line BL for bit data. The bit line BL relies for its High state solely on the electric charge from a precharge operation. In its Low state, the bit line BL is connected to ground. This floating state of the bit line BL is inhibited by bit data holding device 10 that holds the logic state of the bit line. In addition, reset device 20 is provided to reset the holding action of the bit data holding device 10 upon precharging.

When practiced as outlined above, the invention prevents the floating states of bit lines BL in order to stabilize the logic states thereof. False logic states are prevented from occurring. Even if the logic state of the bit line read by the sense amplifier 30 is changed by a memory cell transistor, the through current conventionally associated with the change is suppressed so that any increase in power consumption is avoided. This feature of minimizing the through current is particularly effective where a gate array integrated circuit ROM is constituted by the memory cell transistors prepared in advance. This point is underlined by the fact that, with the prepared transistors in use, the P-channel MOS transistors TP10 and TP11 of FIG. 5 cannot be reduced in size to lower the current level in the on-state.

These and other objects, features and advantages of the invention will become more apparent upon a reading of the following description and appended drawings.

BRIEF DESCRIPTION OF THE DRAWINGS

The preferred embodiments will be described with reference to the drawings, wherein like elements have been denoted throughout the figure with like reference numerals, and wherein.

DESCRIPTION OF THE PREFERRED EMBODIMENT

The preferred embodiment of the invention will now be described with reference to the accompanying drawings.

Figure 2:
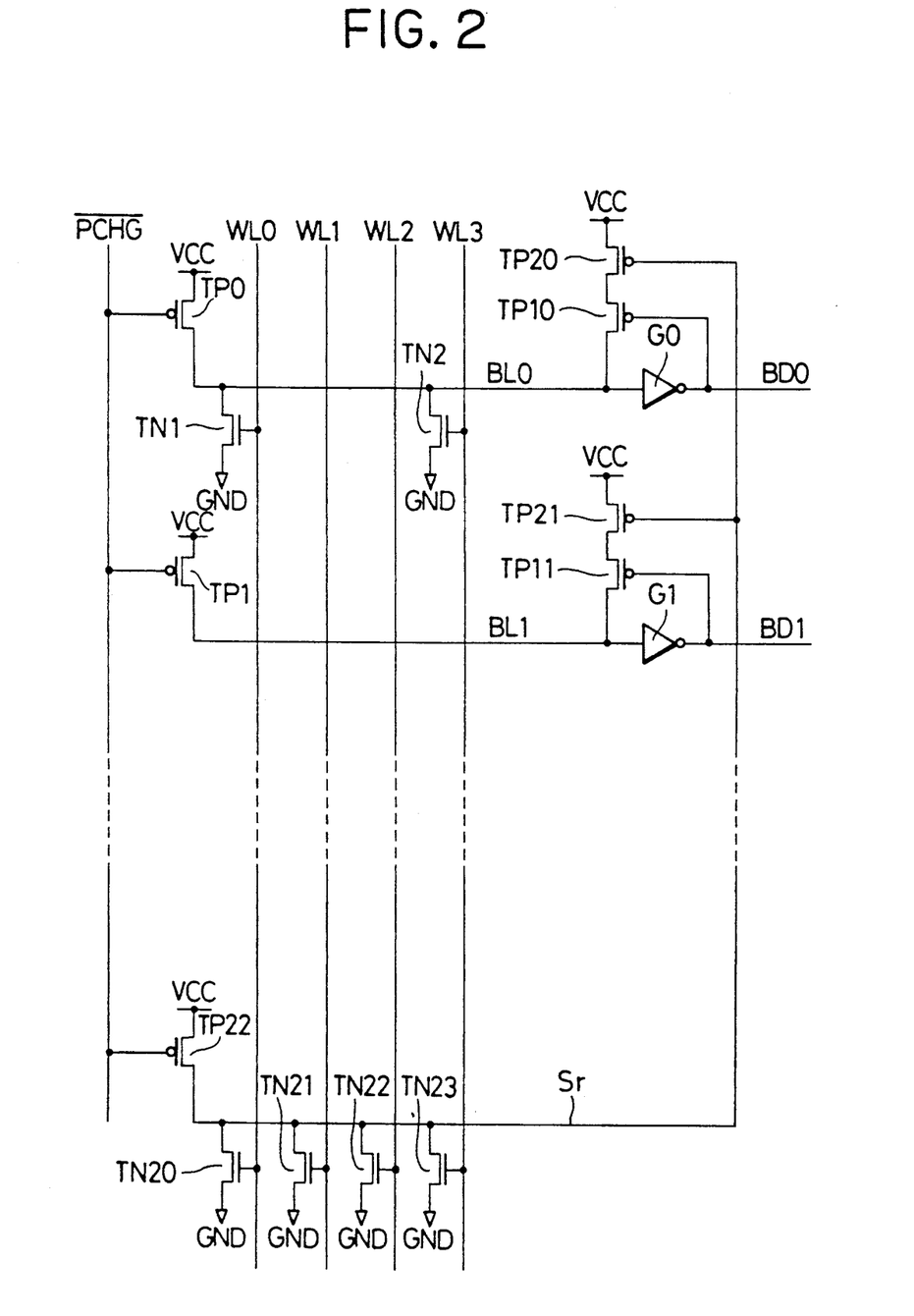
FIG. 2 is a circuit diagram of the embodiment of FIG. 1.

FIG. 2 highlights one portion of the CMOS mask ROM embodying the invention, the portion storing bit data. In FIG. 2, reference characters TP0, TP1, TP10, TP11, TN1, TN2, G0, G1, WL0 through WL3, BL0, BL1, BD0, BD1, PCHG, VCC and GND designate the same parts as those in FIG. 5. The bit data written in this embodiment are the same as those shown in FIG. 4.

In the embodiment, a precharge operation is followed by a read operation that accesses the bit data lines BD0 and BD1 for retrieval of Low-state bit data. At this point, the bit lines BL0 and BL1 are prevented from entering a floating state (i.e., a state wherein the applicable memory cell transistor is disconnected) by bit data holding means implemented in the form of the P-channel MOS transistor TP10 or TP11. The P-channel MOS transistors TP10 and TP11 correspond respectively to the inverters G0 and G1.

When the bit line BL0 or BL1 goes High to enter a floating state (with the memory cell transistor disconnected), bringing the output of the inverter G0 or G1 Low, then the P-channel MOS transistor TP10 or TP11 is turned on. This connects the bit line BL0 or BL1 to the power supply VCC before the bit line is discharged to enter an unpredictable logic state.

The embodiment also includes the reset means comprising a P-channel MOS transistor TP22, N-channel MOS transistors TN20 through TN23, and P-channel MOS transistor TP20 or TP21 corresponding to each bit line BL0 or BL1. The reset means works as follows: During a precharge period preceding the access state, the precharge line PCHG goes Low and the P-channel MOS transistor TP22 is turned on. This brings a signal line Sr High. In turn, the P-channel MOS transistors TP20 and TP21 corresponding to each bit line BL0 or BL1 are turned off. In this manner, the state of each bit line held by the P-channel MOS transistor TP10 or TP11 is reset.

During an access period wherein any one of the word lines WL0 through WL3 is High, one of the N-channel MOS transistors TN20 through TN23 is turned on and the signal line Sr is brought Low. As a result, the P-channel MOS transistors TP20 and TP21 corresponding to each bit line BL0 or BL1 are turned on. In this manner, the bit data held by the P-channel transistors TP10 and TP11 corresponding to each bit line can be held intact.

Many N-channel MOS transistors are connected to the signal line Sr and capacitive load of the signal line Sr is high. Therefore, the transistor TP20 is turned on after the transistor TP10 is turned off and no through current flows through the transistors TP20, TP10 and TN2. However, two inverters may be inserted into the signal line Sr for safety margin.

As described, the read only memory according to the invention prevents the bit lines from entering a floating state wherein their logic states become unpredictable. Whereas the logic states of the bit lines are retained, the retained states are reset upon precharging before the next bit data read operation starts. This inhibits the generation of a through current attributable to the conventional attempt to retain logic states. The scheme suppresses increase in power dissipation of the read only memory apparatus. With power dissipation held in check, the invention removes the unpredictability of bit line logic states, thereby preventing the generation of false logic states.

While a preferred embodiment of the invention has been described using specific terms, such description is for illustrative purposes only, and it is to be understood that changes and variations may be made without departing from the spirit or scope of the following claims.

What is claimed is:

1. A read only memory, comprising:
   at least one bit line;
   a plurality of word lines, wherein each intersection between one bit line and one word line has one of a presence and an absence of a transistor in order to provide a corresponding one of a connection and a disconnection between the bit line and the word line;
   reset means for setting the logic state of the plurality of bit lines to a reset logic state; wherein, when one of the plurality of word lines is selected, the reset logic state of each bit line is altered to a data logic state based on the presence and absence of transistors in the intersections between each bit line and the selected word line; and
   at least one bit data holding means, each bit data holding means associated with a corresponding bit line, for holding the data logic state of the corresponding bit line only when the intersection between the corresponding bit line and the selected one of the plurality of word lines has an absence of said transistor.

2. A read only memory according to claim 1, further comprising precharge means for connecting said bit line to a power supply line prior to the selection of said word line.

3. A read only memory according to claim 1, further comprising sense amplifiers for reading out bit data from said bit line.

4. A read only memory according to claim 3, wherein said sense amplifiers are inverters.

5. A read only memory according to claim 1, wherein said bit data holding means comprises holding transistors inserted between said power supply line and said at least one bit line.

6. A read only memory for storing bit data by establishing one of the presence and absence of a transistor at the intersection between at least one bit line and a word line corresponding to each of the addresses of the bit data to be stored, said read only memory comprising:

bit data holding means for holding the logic state of said at least one bit line of which the logic state is currently read out; and precharge means for connecting said at least one bit line to a power supply line prior to a selection of said word line;

reset means for resetting the held logic state of said bit line prior to the selection of said word line;

sense amplifiers for reading out bit data from said at least one bit line;

wherein said reset means includes:

reset transistors provided interposingly between said holding transistors and said power supply line;

a signal line for controlling the on-off states of said reset transistors;

a power supply connection transistor for connecting said signal line to said power supply line during a precharging period prior to an access state; and grounding transistors, furnished to the respective word lines, for connecting said signal line to ground during said access state.

* * * * *